United States Patent

Lapham et al.

[15] 3,663,920

[45] May 16, 1972

[54] MOUNTING FOR INTEGRATED CIRCUITS

[72] Inventors: Thomas B. Lapham, Milford, Conn.; Leonard H. Feldberg, Spring Valley, N.Y.

[73] Assignee: Burndy Corporation, Norwalk, Conn.

[22] Filed: July 27, 1970

[21] Appl. No.: 58,522

[52] U.S. Cl. ................339/17 CF, 317/101 CP, 339/75 MP, 339/95 D, 339/125 R, 339/176 MP, 339/192 R

[51] Int. Cl. ......................................H01r 13/54, H05k 1/02

[58] Field of Search...................339/119, 125, 75 M, 75 MP, 339/176 M, 176 MP, 174, 65, 66, 66 M, 17, 95 R, 95 D, 176 MF, 192 M, 200, 219–221, 247, 249, 242, 244; 317/99–101

[56] References Cited

UNITED STATES PATENTS 3,475,657 10/1969 Knowles......................339/176 MP X
3,380,016 4/1968 Samson et al...........................339/174
3,011,379 12/1961 Corwin...........................339/17 CF X
3,377,514 4/1968 Ruehlemann et al. ..........339/17 CF X
3,447,122 5/1969 Beck..................................339/273 X

*Primary Examiner*—Marvin A. Champion
*Assistant Examiner*—Terrell P. Lewis
*Attorney*—Howard S. Reiter

[57] ABSTRACT

A large integrated circuit package is dropped into a housing that is attached to a printed circuit board in particular alignment with lead terminals on said board. Leads from the package are applied to the lead terminals when the package is properly positioned in the housing. A securing device having individual cams is moved into a position where it is assembled to the board and receiving means for applying camming pressure against said leads and lead terminals. The leads so engage the lead terminals that they are held against lateral movement during the camming action.

8 Claims, 5 Drawing Figures

INVENTORS
THOMAS B. LAPHAM
BY LEONARD H. FELDBERG
Howard S Reiter
ATTORNEY.

INVENTOR.
THOMAS B. LAPHAM
LEONARD H. FELDBERG

BY Howard S. Reiter

ATTORNEY.

MOUNTING FOR INTEGRATED CIRCUITS

BACKGROUND OF THE INVENTION

1. Field of the Invention

This invention relates to a construction for the installation of an integrated circuit package relatively to a circuit such as a circuit carried by a printed circuit board. More particularly, the invention relates to the assembly of a large scale integrated circuit package to a printed circuit board, so as to place a plurality of leads of the large scale integrated circuit in effective electrical contact with the lead terminals of the printed circuit board, while not soldering the leads to the lead terminals. The elimination of a soldered connection has many advantages that are fully understood by those skilled in the art.

2. Description of the Prior Art

With the development of integrated circuits, the problem of assembling said circuits to circuits such as found on a printed circuit board, without soldering, while yet establishing effective electrical contact between the lead terminals of the circuit boards and the integrated circuits, has been attacked by many inventors. A number of patents have issued to inventors covering means for assembling a small integrated circuit to a testing apparatus and also to a printed circuit board without soldering, but these means are not considered to be effective solutions of the problem. The even greater problem of effectively assembling a large scale integrated circuit package to a printed circuit board without soldering, appears to present such very considerable additional difficulties that an effective solution has evaded those working in the art.

In one prior art construction utilized for assembling an integrated circuit package to a panel board, the small package is placed in a carrier or support block to which it is assembled by the bending of the leads extending from the integrated circuit package about the support block and the addition of a locking member to hold the bent leads in bent position. The carrier block with the integrated circuit thus assembled thereto, is then pushed or otherwise placed into a connector in the form of a relatively large assembly block in which there are a number of spring contact fingers or leads extending from the parts of the printed circuit to which the integrated circuit is adapted to be assembled. It is obvious that this type of construction requires the deformation of the integrated circuit leads and possible damage to the circuit as well as the leads, and also requires the addition to the printed circuit board of a rather complex upstanding assembly block of rather considerable size. In addition, the assembly relies on the spring action of the spring fingers within the assembly block which are additional to the normal lead terminals of a printed circuit board.

In another construction of the prior art, the small integrated circuit is placed in a carrier to which the actual body of the integrated circuit is held by spring detents. The carrier with the integrated circuit held thereby, is then adapted to be applied to a test device which has a number of spring fingers extending therefrom to be aligned with the leads extending from the integrated circuit package. Through the utilization of a closure on the test device applied to the carrier, the integrated circuit leads are held against the various spring fingers of the test device, and electrical contact is thus made between the leads of the integrated circuit and the spring fingers. It will be appreciated that the pressure between the spring fingers and the leads from the integrated circuit, is purely spring pressure, and requires the addition of a closure or similar pressure device. At best, only temporary installation of the integrated circuit for testing is effected.

In a further construction of the prior art, a printed circuit board is equipped with a relatively complex receiving device that is assembled thereto in particular alignment with the lead terminals of the board. The small integrated circuit package is then deposited in the receiving device. Thereafter, through the use of spring latching means that are secured to the printed circuit board, a relatively large clamp is applied to the printed circuit board, and through a resilient silicone rubber pad applies pressure to the integrated circuit and the leads extending therefrom, so as to hold the leads in electrical engagement with the plurality of lead terminals of the printed circuit board. It will be well appreciated that the clamp depends upon a spring action between it and the spring latch on the printed circuit board, as well as the resilence of the rubber pad. It also requires the resilient pad to deform sufficiently to escape guides for the leads. Certainly, the construction cannot be utilized effectively as part of a permanent electrical circuit, as those skilled in the art will well appreciate.

SUMMARY OF THE INVENTION

A feature of this invention resides in the utilization of a relatively small and simple receiving device adapted to be applied to a printed circuit board, after which a large integrated circuit package may be dropped into the receiving device and to lie there with its plurality of leads in overlying alignment with the lead terminals of the printed circuit board, securing means being then readily movable into position between the receiving means and the printed circuit board, for applying pressure between the leads of the integrated circuit and the lead terminals of the printed circuit board. It will be particularly noted, that the securing means are not utilized for bringing about pressure on the integrated circuit package itself, or any strain between the integrated circuit package and its plurality of leads. This naturally contributes to the life of the integrated circuit, as there is an effective absence of stress between its leads and the circuit package.

As a further feature of the invention, the securing means are so formed as to exert considerable pressure directly against each of the leads of the integrated circuit and a corresponding lead terminal of the printed circuit board. The pressure thus developed does not in any way affect the relationship between the integrated circuit leads and the integrated circuit itself, and is of the type adapted to develop extremely effective electrical contact. Naturally, this eliminates the need for making premanent contact as in those constructions utilizing soldering. At the same time, there is contributed the feature of a removable integrated circuit package. Thus, the large scale integrated circuit package may readily be taken away from the printed circuit board and replaced by another package having a somewhat different circuit, as may be required. The value of a construction of this type is obvious.

As a further particular feature of the invention, the securing means utilizes a series of individual camming parts, which preferably are in the form of spring cams, each of which applies individual pressure to individual leads and lead terminals. In this way, an extremely effective circuit is formed between each of the lead terminals and each of the leads.

As a still further feature of the invention, the securing means are moved and guided between the receiving device and the printed circuit board, so as to press effectively against the leads of the integrated circuit package to bring them into effective contact with the printed circuit lead terminals.

As a further extremely important feature of the invention, the leads extending from the integrated circuit package are formed preferably at their ends with interlocking means such as extremely sharp locking portions in the form of wedges or pointed nibs. Upon application of pressure, the wedges or nibs are driven into the relatively soft metal of the printed circuit leads so as to establish an extremely effective electrical contact therebetween, and also a contact that is not subject to attack by gases. Those skilled in the art will readily appreciate the value of this particular feature. More particularly this feature also contributes a means for holding the leads of the integrated circuit package against sliding or other movement by the camming securing means as the camming securing means move the integrated circuit leads against the lead terminals of the circuit board. It will be appreciated that any movement of the integrated circuit leads along the upper surface of the printed circuit lead terminals will tend to scratch the terminals and to remove the metal thereof from the printed circuit supporting board.

It appears therefor, that the object of this invention is to provide means for assembling to a printed circuit board a large integrated circuit package in such a manner as to bring about effective contact of the leads of the integrated circuit package relatively to the lead terminals of the printed circuit board, without requiring soldering, and without deforming the leads or straining the leads relatively to the integrated circuit package.

BRIEF DESCRIPTION OF THE DRAWINGS

The novel features that are believed to be characteristic of this invention are set forth with particularity in the appended claims. The invention itself, however, both as to its organization and method of operation, together with further objects and advantages thereof may best be understood by reference to the following description taken in connection with the accompanying drawings in which:

FIG. 2 is a section taken along line 2—2 of FIG. 1 showing a large integrated circuit package in phantom, while

DESCRIPTION OF THE INVENTION

Figure 4:
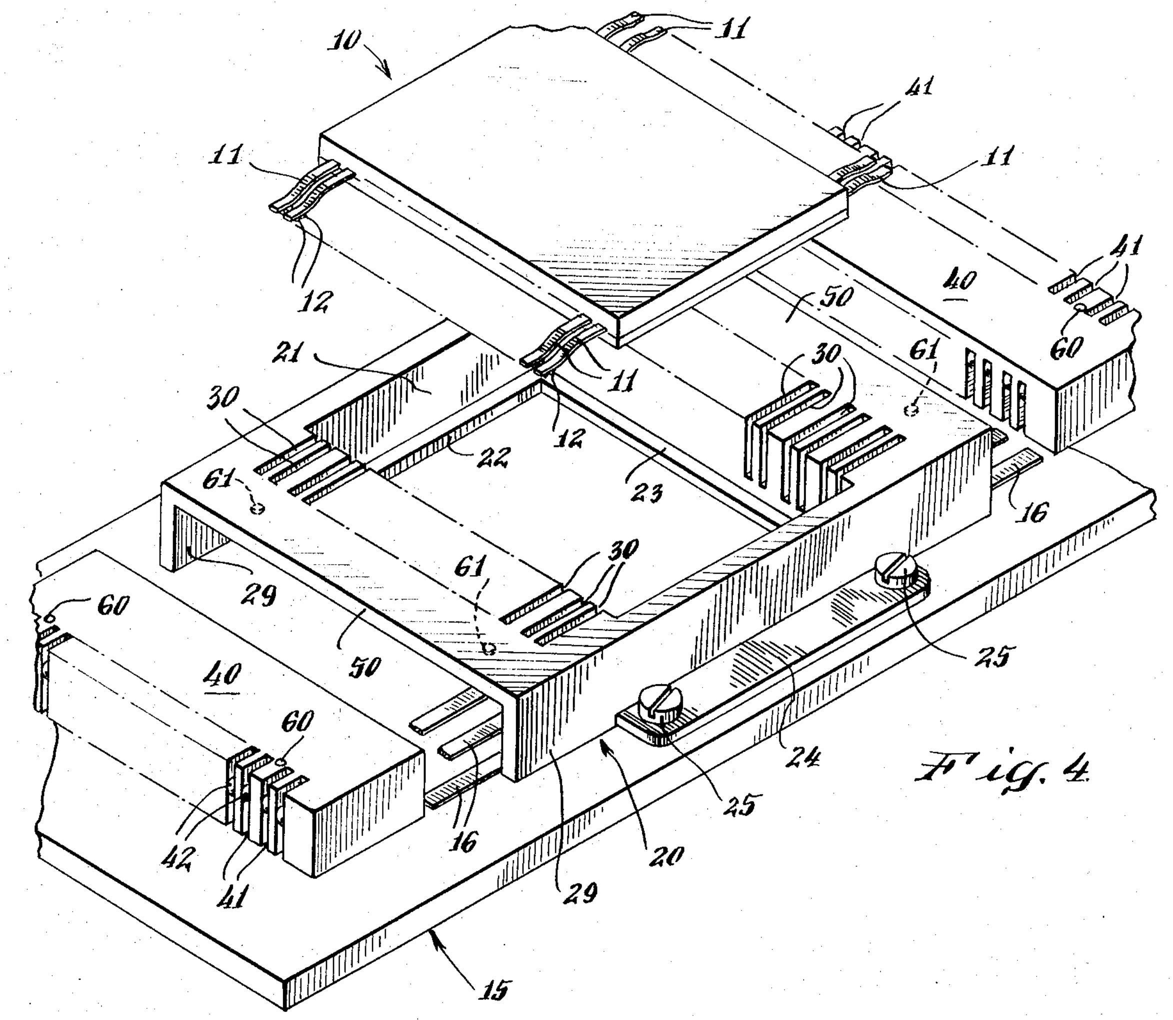
FIG. 4 is an exploded isometric view showing the receiving device applied to a printed circuit board, with an integrated circuit package adapted to be dropped into the receiving device for assembly to the printed circuit board through the intermediary of the securing means.

Referring now more particularly to the drawings, the large integrated circuit package utilized in the invention is designated generally by reference numeral 10 and is well shown in isometric in FIG. 4. It has extending therefrom, as is common in the art, a considerable number of leads, each of which is designated by reference numeral 11. For bringing about effective assembly of the leads 11 to the lead terminals of the printed circuit board, as has already been discussed, each of the leads 11 is equipped with one or two wedges or nibs 12 as is particularly well illustrated in FIG. 5.

The printed circuit board utilized in connection with the invention is designated generally by reference numeral 15, and has a considerable number of lead terminals each designated by reference numeral 16 extending from the circuit of the board (not shown). The printed circuit and the lead terminals 16 are formed by the etching away of a metalized pad that has been thermo-compression bonded to the board 15 itself as is known in the art. This contributes the relatively soft metal lead terminals 16.

The receiving device of the invention is a housing designated generally by reference numeral 20, and may take the form of relatively low upstanding block defining a central opening 21 into which extend supporting end flanges 22 and side flanges 23. Each of the end walls of the housing 20 has a flange 24 adapted to rest against the printed circuit board 15 as well illustrated in FIG. 4, and to be assembled thereto by screws 25 passing through openings 26.

The side walls of the housing 20 are formed with a series of slots 30 as well illustrated in the several figures, these slots being adapted for alignment with the leads 11 and to guide those leads into proper relationship to the lead terminals 16 of the printed circuit board 15.

Figure 5:
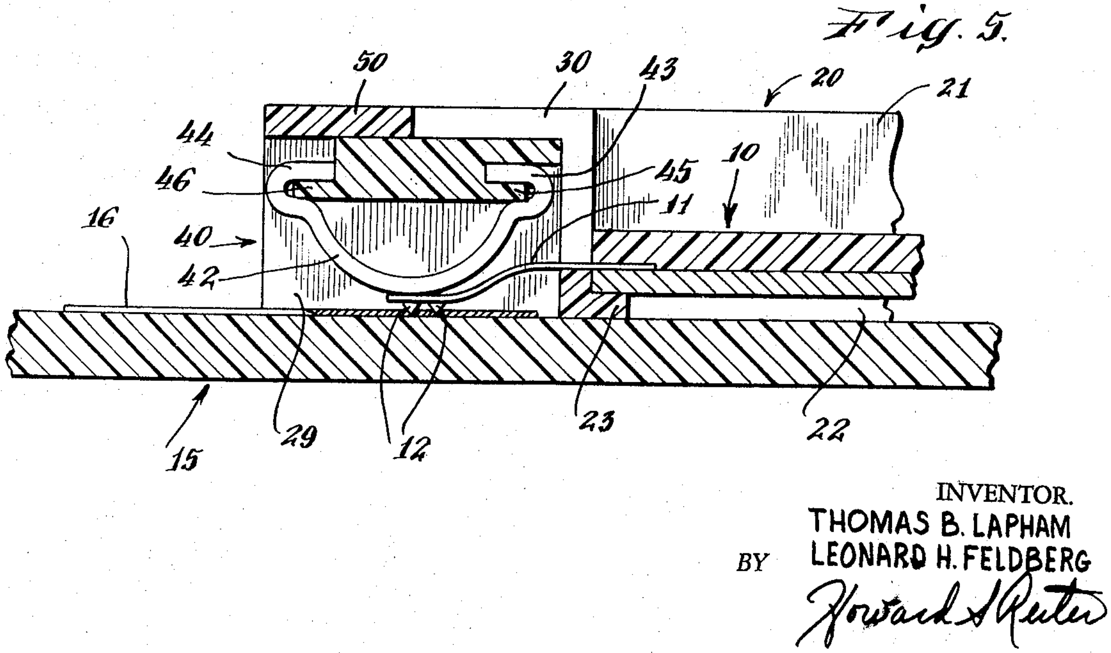
FIG. 5 is a section showing a securing means assembled between the printed circuit board and the receiving device, and applying pressure to a lead from the integrated circuit package to a lead terminal of the printed circuit board.

Thus, as can well be understood from FIGS. 4 and 5, the integrated circuit package 10 is dropped downwardly into the device 20 until the peripheral margin of its bottom surface rests on the series of flanges 22, 23. As probably best illustrated in FIG. 2, where circuit package 10 is seen in phantom, this brings the nibs or wedge portions 12 of the several leads 11 into contact with the lead terminals 16. It will be appreciated that in this position of the parts, there is actually no stress whatsoever between the leads 11 and the integrated circuit package 10 of which they are a part.

The securing means of the invention are adapted to bring about the effective assembly of the leads 11 to the terminals 16 for creating an effective gas tight electrical contact therebetween, all without stressing the leads 11 relatively to the integrated circuit package 10. Generally, two securing means are utilized, one for each side of the housing 20 and the integrated circuit package 10, and since they are idential, but one will be described. As can best be seen in the several figures of the drawings, the receiving means is in the form preferably of a plastic casting 40 having a series of slots 41 adapted for effective alignment with the slots 30 of the housing 20 when the casting 40 is placed between end walls 29 of housing 20.

Figure 1:
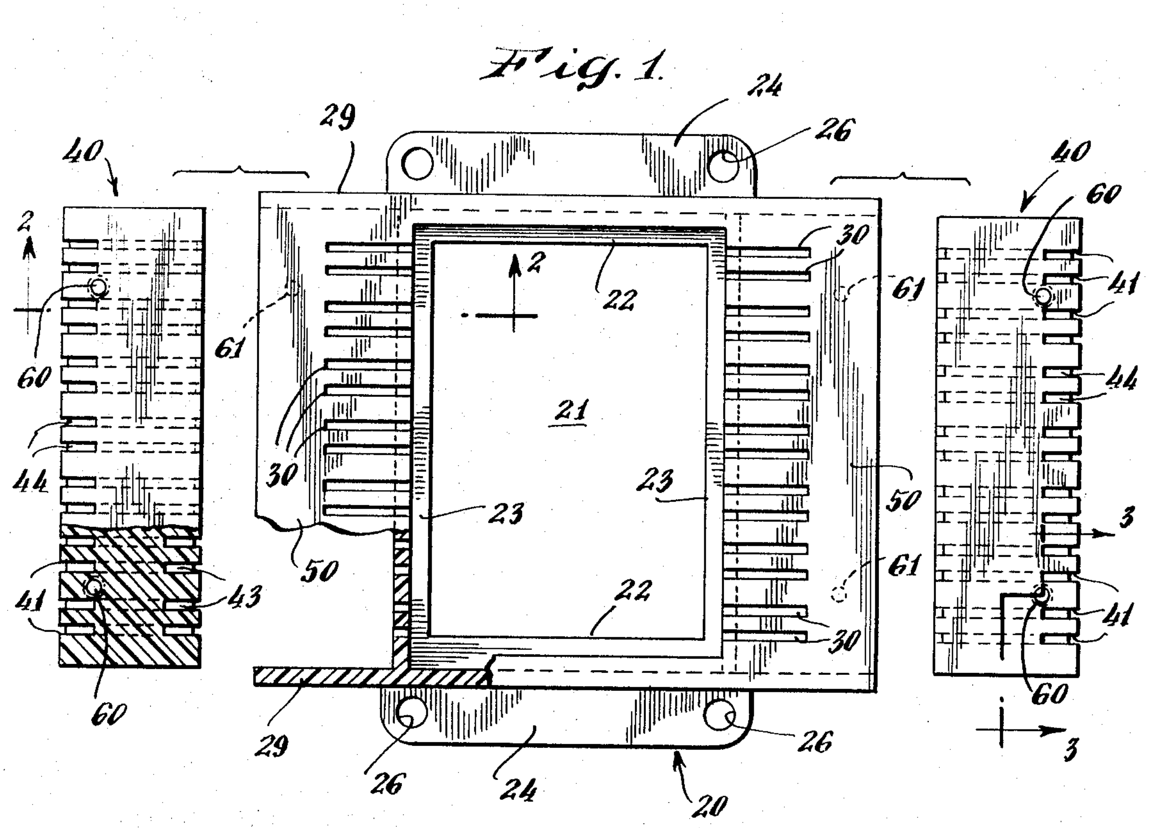
FIG. 1 is a plan view of the receiving means and the two securing means that may be used in combination therewith to bring about the assembly of the integrated circuit package to a printed circuit board.
Figure 2:
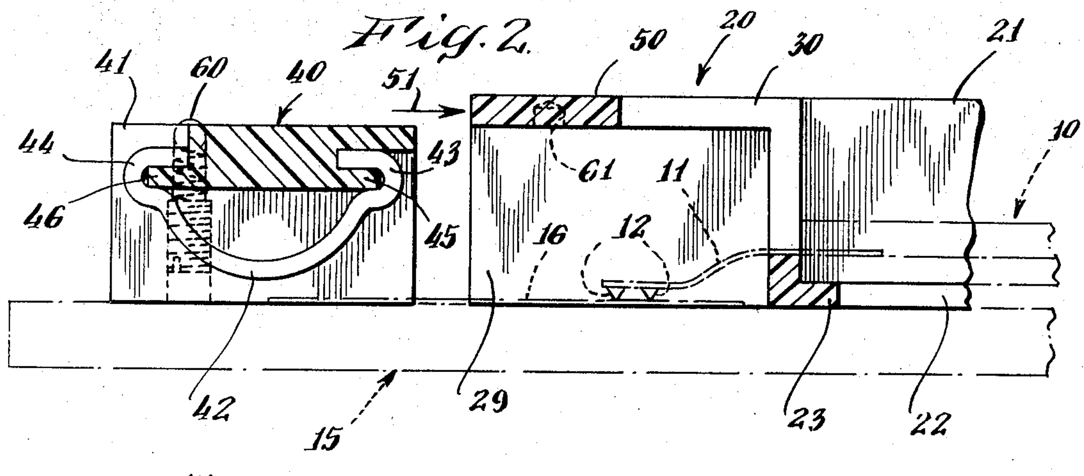

The casting 40 is so formed that in each of the slots 41 there may be mounted a relatively stiff spring-like camming device 42 best seen in FIG. 2 and 5. This camming device is formed with retaining portions 43 and 44 that are adapted to snap onto horizontal flanges 45 and 46 formed integrally with the casting of the securing means 40. Obviously, the camming devices 42, lying each within a slot 41, will be in exact alignment with the integrated circuit leads 11 after those leads move downwardly through the slots 30 in the receiving device 20 against the terminals 16, since the terminals 16 will be applied to the printed circuit board 15 in exact alignment with the slots 30 of the receiving device 20. As can well be seen in FIGS. 2, 4 and 5, the device 20 is formed with an overhanging flange 50 between its walls 29, and the securing means 40 is adapted to move in the direction of the arrow 51 from its position of FIG. 2 to its position of FIG. 5 under the flange 50, after the integrated circuit package has been dropped into the receiving device 20 as shown in phantom in FIG. 2. The first pressure exerted against each of the leads 11 by a cam 42 as securing means 40 so moves, will bring about pressure between wedges or nibs 12 against the relatively soft metal of a terminal 16. The nibs or wedges 12 will prevent any lateral sliding of the lead 11 relatively to the terminal, and instead, the nibs 12 will move downwardly into the metal of the lead terminal and will deform the terminal 16 to form a gas tight electrical connection. Actually, and without limiting the invention, the nibs 12 are adapted to be moved downwardly into a lead 16 a distance of five thousandths of an inch. While this will bring about an extremely effective electrical contact between leads 11 and terminals 16, it does not in any way stress the relationship between any one of the leads 11 and the integrated circuit package 10.

Figure 3:
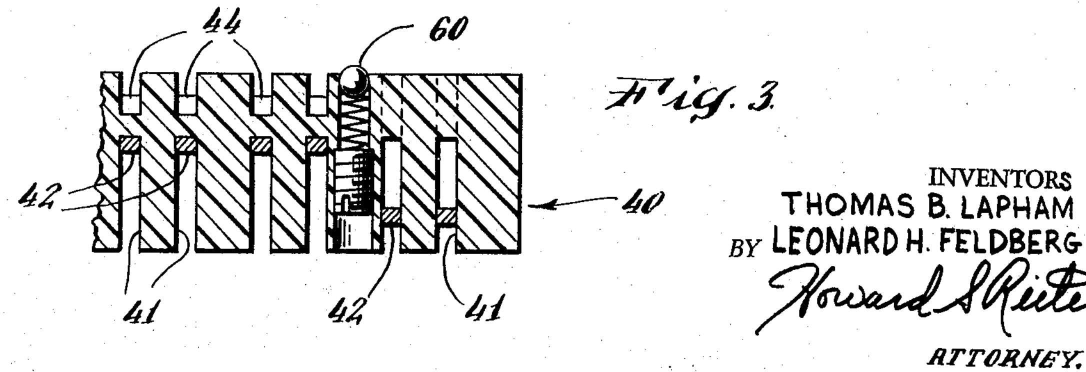
FIG. 3 is a section taken along line 3—3 of FIG. 1.

While it is thought that each of the receiving means 40 will be retained effectively by friction in the position of FIG. 5 after movement from the position of FIG. 2 under the flange 50, yielding spring pressed ball detents 60, particularly shown in FIG. 3 may be utilized. Thus, each of the flanges may have several bores 61 into which the balls 60 may enter for yieldingly holding the receiving devices 40 in the position shown in FIG. 5.

It is thought that the considerable value of the invention, and its contribution over the prior art will be well appreciated.

What is claimed is:

1. In a combination of the class described, a circuit board having a plurality of lead terminals formed of relatively soft metal, a circuit package such as a large integrated circuit having a plurality of leads to be matched to and secured effectively to said lead terminals, circuit package receiving means on said circuit board into which said circuit package is deposited for effective alignment of its plurality of leads with said lead terminals, securing means movable relatively to said circuit board and said receiving means, guide means fixed relatively to said board and spaced therefrom, said securing means having guide surfaces engaging both said guide means and said board for guiding said securing means into a position functionally between said guide means and board in which it is held assembled to said board and said guide means through said guide surfaces, said securing means including individual cam shaped spring means exerting pressure individually against each of said lead terminals and said plurality of leads when said securing means is so held assembled to said guide means and said board.

2. In the combination of claim 1, the feature that said circuit package is freely deposited in said package receiving means and is secured to said board only through said plurality of leads.

3. In the combination of claim 1, the feature that said integrated circuit package receiving means has a flange or the like overlying said board and its plurality of lead terminals, and said securing means being adapted for movement into a position between said flange and board.

4. In the combination of claim 3, the feature that said circuit package receiving means has a series of slots into which said circuit package leads are placed as said package is deposited in said receiving means, said securing means having also a series of slots formed in accordance with the slots in said circuit package receiving means for alignment therewith, said parts of said securing means comprising a cam housed in each of said slots in said securing means for pressing said leads and terminals toward one another and to hold them in pressure relation thereafter, said cams moving in effective alignment with said leads and terminals through guidance by said guide means and board of said securing means into a position between said flange and board.

5. In the combination of claim 1, the feature that said integrated circuit package receiving means has a series of slots into which said circuit package leads are placed as said package is deposited in said receiving means, said securing means having also a series of slots formed in accordance with the slots in said circuit package receiving means for alignment therewith, said cam shaped springs being disposed within each of said slots in said securing means for pressing said leads and terminals toward one another and to hold them in pressure relation thereafter, said cams moving in effective alignment with said leads and terminals through guidance by said board and guide means.

6. In the combination of claim 1, the feature that said leads are formed with relatively sharp portions to be embedded in said lead terminals by said cam means.

7. In the combination of claim 1, the feature that said securing means is a body that is held bodily against the board by said receiving means when guided to its assembled position.

8. In a combination of the class described, a circuit board having a plurality of lead terminals, a circuit package such as a large integrated circuit package having a plurality of leads to be matched to and secured effectively to said lead terminals, circuit package receiving means on said circuit board into which said circuit package is deposited for effective alignment of its plurality of leads with said lead terminals, a flange or the like overlying portions of the said aligned leads and lead terminals and said board at a side of said receiving means, securing means adapted to move into position under said flange and over said leads and lead terminals, and parts of said securing means operative when said securing means is under said flange for pressing said leads against the lead terminals with which they are aligned, said flange or the like accepting the reaction of the pressure exerted by said parts of said securing means.

* * * * *